United States Patent [19]
Uenoyama

[11] Patent Number: 5,535,162
[45] Date of Patent: Jul. 9, 1996

[54] ELECTRICALLY ERASABLE READ ONLY MEMORY

[75] Inventor: Hiromi Uenoyama, Kyoto, Japan

[73] Assignee: Rohm Co., Ltd., Kyoto, Japan

[21] Appl. No.: 361,871

[22] Filed: Dec. 22, 1994

Related U.S. Application Data

[63] Continuation of Ser. No. 114,183, Sep. 1, 1993, abandoned.

[30]   Foreign Application Priority Data

Sep. 1, 1992  [JP]  Japan ..................................... 4-233437

[51] Int. Cl.$^6$ ................................................... G11C 16/00
[52] U.S. Cl. .................... 365/200; 365/189.01; 371/21.1
[58] Field of Search ....................... 365/189.01, 230.01,
  365/200; 371/10.1, 10.2, 10.3

[56]   References Cited

FOREIGN PATENT DOCUMENTS 2-192099  7/1990  Japan .
2016759   9/1979  United Kingdom .
83-02847  8/1983  WIPO .

*Primary Examiner*—Viet Q. Nguyen
*Attorney, Agent, or Firm*—Fish & Richardson

[57]   ABSTRACT

In an electrically erasable programmable ROM in which written data contains in a very limited part high-frequency reload data, the memory capacity is reduced in the following new way. An address detecting circuit (12) detects whether or not designated write addresses are within a predetermined range and discriminates the write object data, which is to be high-frequency reload data, if the designated write addresses are within the predetermined range as the result of detection. Then, three sets of identical data ($D_7$ to $D_0$) prepared by a data creating circuit (11) are overwritten respectively in three different memory cells ($A_0$, $A_0'$, $A_0''$). In data reading, the individual data are read from the respective memory cells, and one of the data decided by a majority logical circuit (15) is outputted as read data.

6 Claims, 6 Drawing Sheets

ELECTRICALLY ERASABLE READ ONLY MEMORY

This application is a file wrapper continuation of U.S. application Ser. No. 08/114,183, filed Sep. 1, 1993, now abandoned.

BACKGROUND OF THE INVENTION

1. Field of the Invention

This invention relates to a nonvolatile memory, and more particularly to an electrically erasable read only memory (EEPROM).

2. Description of the Related Art

In various kinds of recent electronic equipments, EEPROMs are used as initialization memories. Occasionally, in consumer market appliances such as televisions and cameras, data which needs to be frequently updated and initialization data which only occasionally reloaded after being once written are stored in a mixed fashion in a nonvolatile memory. For example, in a television, if the power supply is switched off, data of the last channel being viewed immediately before the switch off, i.e. channel information such as a receiving frequency, volume and degree of screen brightness, is stored in the memory so that the television will start operating in the same conditions as before when it is switched on the next time. Since such data (hereinafter called "last channel memory data") is stored whenever the power supply is switched off, the memory is reloaded repeatedly. On the contrary, initialization data for presetting to match a channel button with a frequency rarely needs to change after having been set up once, and the memory must be reloaded only several times at most.

FIG. 7 shows a U-shaped curve representing the reloading characteristic of an EEPROM. Initial failure, which results from various causes in the manufacturing process, can be screened by conducting tests; but random failure and wear-out failure would still be problems. In a random failure region, though its failure frequency is very approximately zero, a much better idea is needed to get it to be absolutely zero. In a wear-out region, since the frequency of reloading and failure frequency increase, measures would be required to increase the frequency of reloading as high as possible until it enters the wear-out region.

One of the conventional measures employs a so-called ECC (error correction code) system.

In the ECC system, when correcting a 1-bit error, for example, 4-bit parity data is needed for 1-word-8-bit data. If this method is applied to every word address, the chip size would be large to increase the cost of production. Similarlly to a television receiver, in the case where last channel memory data which need to be reloaded frequently and preset memory data which rarely need to be reloaded are stored in the memory in a mixed fashion, wear-out failure as shown in FIG. 7 need scarcely be considered for the latter, i.e., preset memory data, but only for last channel memory data. However, according to this conventional method, since the ECC system is used to add parity bits to every word address of EEPROM even if the last channel memory data occupies only several bytes, it requires many more memory bits than necessary, which thereby increases the cost of production.

SUMMARY OF THE INVENTION

It is therefore an object of this invention to provide an electrically erasable read only memory which is inexpensive and is highly reliable when used in storing, in a mixed fashion, data to be reloaded frequently and data to be rarely reloaded.

According to a first aspect of the invention, there is provided an electrically erasable read only memory for storing, in a mixed form, data to be reloaded at high frequency and data to be reloaded at low frequency, comprising: data identifying means for identifying whether object data to be written is the high-frequency reload data or the low-frequency reload data; and data reloadable control means for writing in memory cells said object data by a predetermined highly reliable method if said object data is the high-frequency reload data as the result of identification of said data identifying means and for writing in memory cells said object data by an ordinary method if said object data is the low-frequency reload data.

In the first arrangement, discrimination is made as to whether the object data to be written is high-frequency reload data or low-frequency reload data, and writing is performed in conformity with the result of discrimination.

According to a second aspect of the invention, there is provided an electrically erasable read only memory for storing, in a mixed form, data to be reloaded at high frequency and data to be reloaded at low frequency, comprising: write address detecting means for detecting whether or not designated write addresses are within a predetermined range; data writing means for discriminating said object data to be the high-frequency reload data only when said write addresses are within the predetermined range as the result of detection by said write address detecting means and then overwriting said object data in a plurality of memory cells; and read data deciding means for reading said data written in said plural memory cells by said data writing means when said predetermined range of addresses are designated during reading and for deciding one of the read data.

In the second arrangement, detection is made of whether or not the designated write addresses are within a predetermined range, and as a result, if they are within the predetermined range, the object data to be written is judged to be the high-frequency reload data and is overwritten ill plural memory cells. For reading, one of the read data is decided for output, based on the written data.

According to a third aspect of the invention, there is provided an electrically erasable read only memory for storing, in a mixed form, data to be reloaded at high frequency and data to be reloaded at low frequency, comprising: write address detecting means for detecting whether or not designated write addresses are within a predetermined range; data writing means for discriminating that said object data is the high-frequency reload data only when said write addresses are within said predetermined range as the result of detection by said write address detecting means and writing in memory cells said object data with an error correction code added; and error correcting means for reading said data, which is written by said data writing means, when said predetermined range of addresses are designated during reading and for making an error correction based on said error correction code.

In the third arrangement, detection is made whether or not the designated write addresses are within a predetermined range, and as a result, if they are within the predetermined range, the object data to be written is judged to be the high-frequency data and is written in memory cells after an error correction code is added. For reading, error correction is made using the error correction code.

According to a fourth aspect of the invention, there is provided an electrically erasable read only memory for storing, in a mixed form, data to be reloaded at high frequency and data to be reloaded at low frequency, comprising: write address detecting means for detecting whether or not designated write addresses are within a predetermined range; data writing means for discriminating said object data to be the high-frequency reload data only when said write addresses are said predetermined range as the result of detection by said write address detecting means and for writing said object data and reverse data thereof respectively in different memory cells; and differential data creating means for reading both said object data and said reverse data, which are written by said data writing means, when said predetermined range of addresses are designated during reading and for creating read data according to the difference between said object data and said reverse data.

In the fourth arrangement, detection is made of whether or not the designated write addresses are within a predetermined range, and as a result, if they are within the predetermined range, the object data to be written is the high-frequency reload data, and the object data to be written and its reverse data are written in the respective memory cells. For reading, the difference between the original data and the reverse data is outputted as read data.

DETAILED DESCRIPTION

Embodiments of this invention will now be described in detail with reference to the accompanying drawings.

Figure 1:
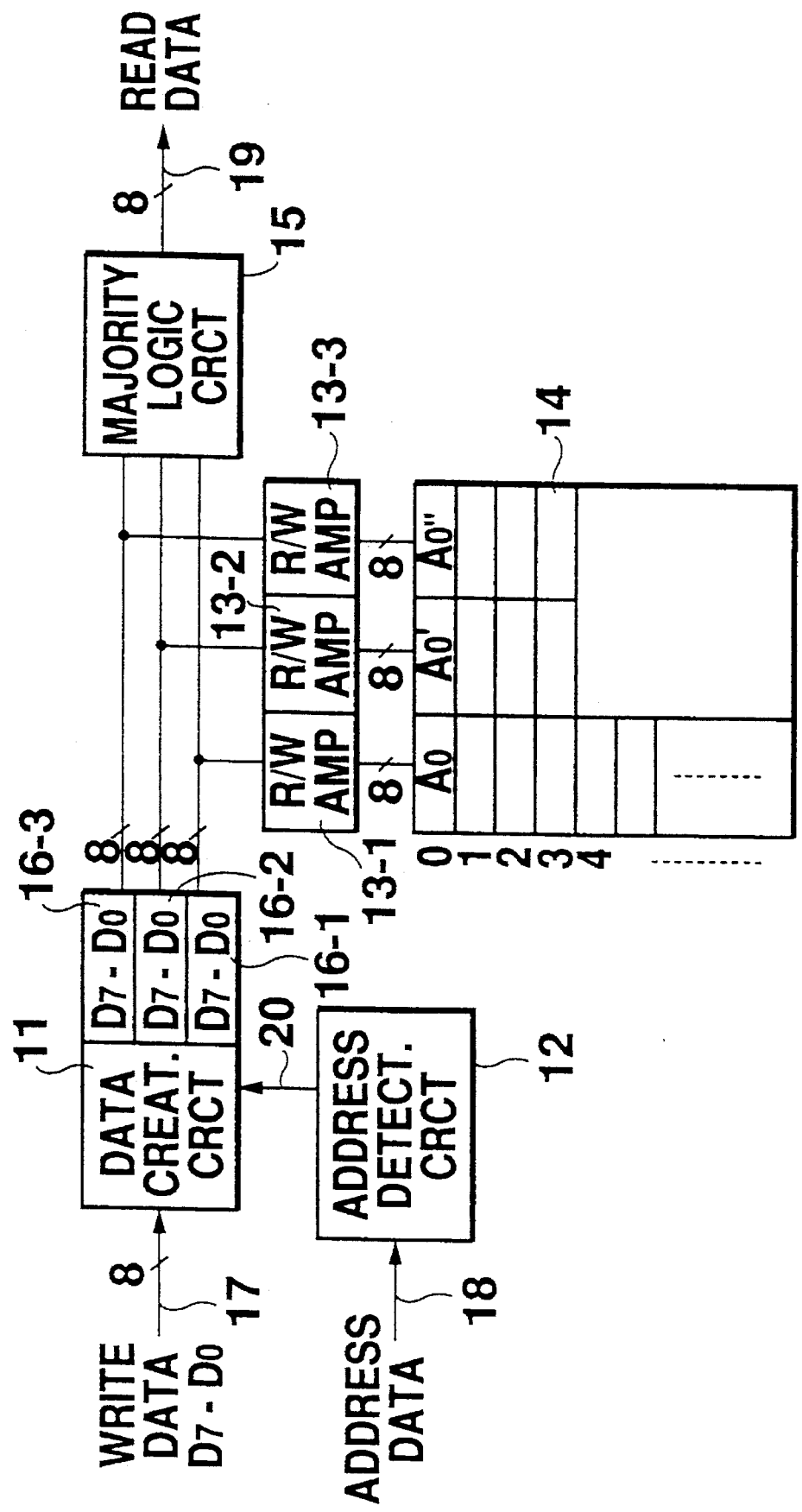
FIG. 1 is a block diagram showing an EEPROM according to a first embodiment of this invention.

FIG. 1 shows an EEPROM according to a first embodiment of this invention. In the EEPROM, 1 word consists of 8 bits. As shown in FIG. 1, this circuit is equipped with a data creating circuit 11 connected to an address detecting circuit 12. When $D_7$-$D_0$ as 8-bit wide write data 17 are inputted to the data creating circuit 11, the address detecting circuit 12 checks address data 18 and outputs a detection signal 20 to the data creating circuit 11 if designated addresses are within a predetermined range. Upon receipt of the detection signal 20, the data creating circuit 11 writes the write data $D_7$-$D_0$ into registers 16-1–16-3, respectively. The predetermined range of addresses are four addresses of "0"–"3", in which high-frequency reload data is to be written. In other word addresses at which low-frequency reload data is to be written.

The data of the registers 16-1–16-3 are written into memory cells of the corresponding word address of a memory 14 in parallel via read/write amplifiers 13-1– 13-3, respectively. In the illustrated example, the data is written into three memory cells $A_0$, $A_0'$, $A_0''$, respectively, of the word address "0".

If the address detected by the address detecting circuit 12 is other than four addresses of "0"–"3", the data creating circuit 11 sets the data only in the register 16-1 and then writes it only into the memory cell $A_0$ of the corresponding word address.

For reading this data, data is read from the respective memory cells $A_0$, $A_0'$, $A_0''$ of the address "0", for example, and is inputted to a majority logical circuit 15 via the read/write amplifiers 13-1–13-3. The majority logical circuit 15 takes two or more pieces of data out of three pieces of data having been read and outputs them as read data 19.

Thus, in this embodiment, data to be frequently reloaded is written trebly, while data to be scarcely reloaded is written singly. Regarding the threefold data, since reading is done by majority logic, occurrence of data error is reduced to a minimum to secure reliability.

Figure 2:
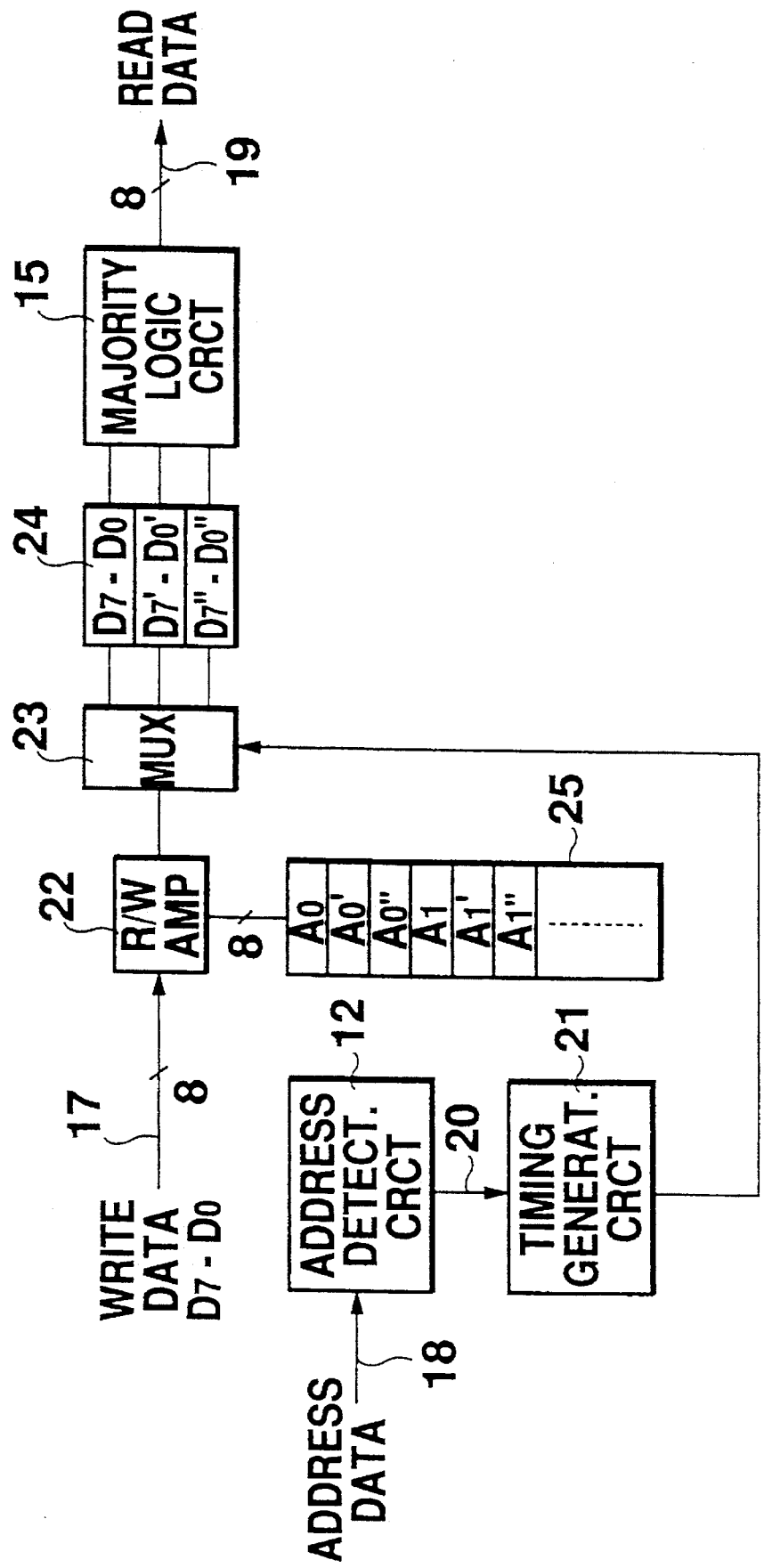
FIG. 2 is a block diagram showing an EEPROM according to a second embodiment of the invention.

FIG. 2 shows an EEPROM according to a second embodiment of the invention. In FIG. 2, parts or elements similar to those of the first embodiment (FIG. 1) are designated by the same reference numerals, and repetition of their description is omitted. In this embodiment, if the write address detected by the address detecting circuit 12 is any of "0"–"3", the write data $D_7$-$D_0$ are written in different word addresses of a memory 20 via a read/write amplifier 22 trebly and serially. For reading, when the address detecting circuit 12 has detected the read address of the high-frequency reload data, a timing signal is outputted from a timing generating circuit 21 to control the switching operation of a switch 23. Thereby data is read from the respective memory cells $A_0$, $A_0'$, $A_0''$ corresponding to the three different word addresses and is stored, as data $D_7$-$D_0$, $D_7'$-$D_0'$, $D_7''$-$D_0''$, in a register 24 via the switch 23. These values of the register 24 are read to the majority logical circuit 15 where read data are decided and outputted as the read data 19. On the other hand, if the written address is other than "0" to "3", the data is written into a single word address.

Thus, in this embodiment, since data to be frequently reloaded is written trebly and is read by majority logic, data errors are reduced to secure reliability.

Figure 3:
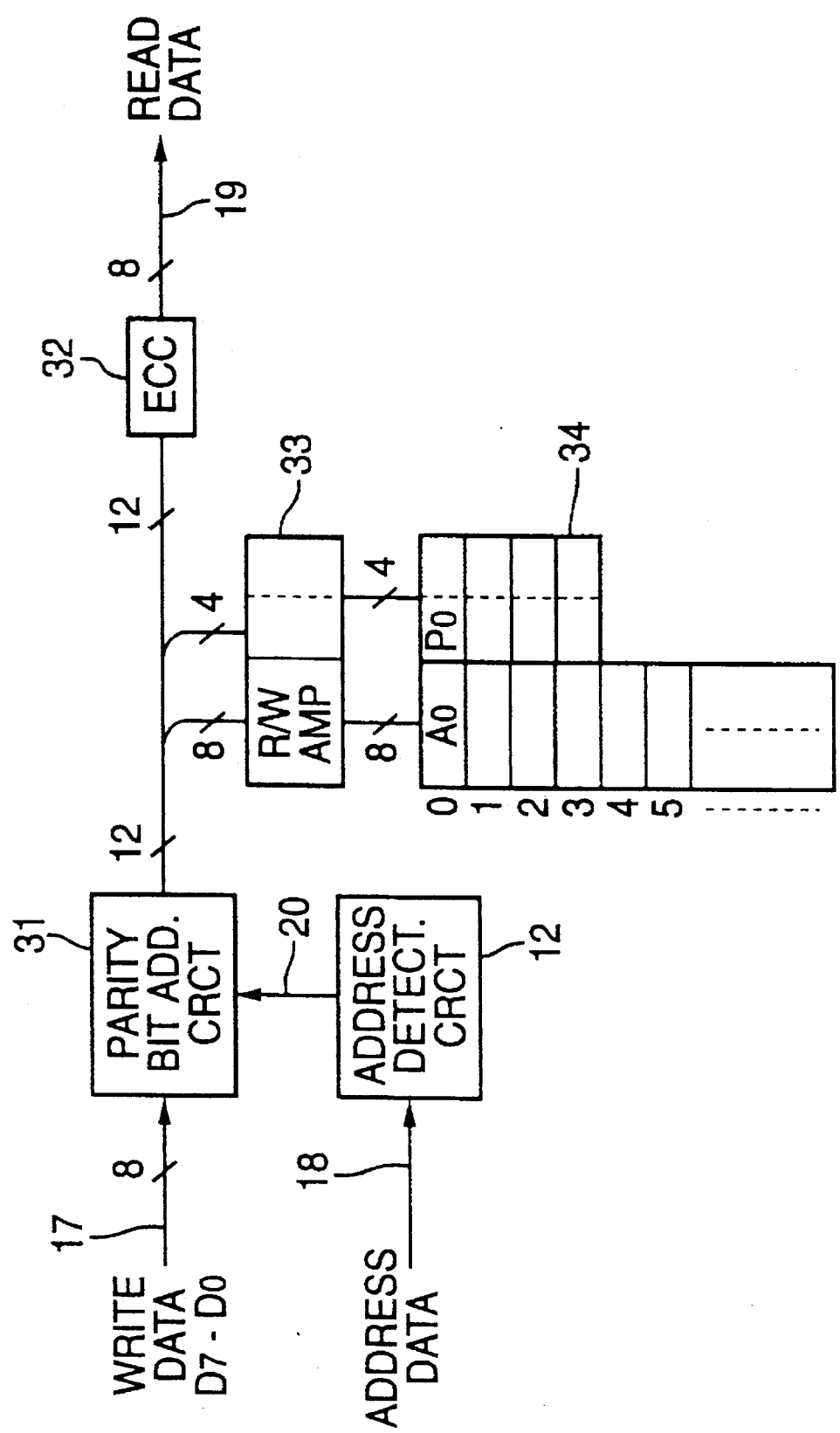
FIG. 3 is a block diagram showing an EEPROM according to a third embodiment of the invention.

FIG. 3 shows an EEPROM according to a third embodiment of the invention. The circuit of this embodiment, as shown in FIG. 3, is equipped with a parity bit adding circuit 31 for adding 4-bit parity data to 8-bit data and writing them into a memory 34 via a read/write amplifier 33. For example, if the address is "0", the data is written into the memory cell $A_0$ and the memory cell $P_0$. For reading, 8-bit data and 4-bit parity data, 12 bits in total, are read to an ECC circuit 32 where error correction is carried and the corrected data is output as 8-bit read data 19.

If the detected write address is other than "0"–"3", only data $D_7$-$D_0$ are written with no parity bit added.

Thus, in this embodiment, since error correction is done by adding parity bits only to high-frequency reload data, data errors can be minimized to secure reliability.

Figure 4:
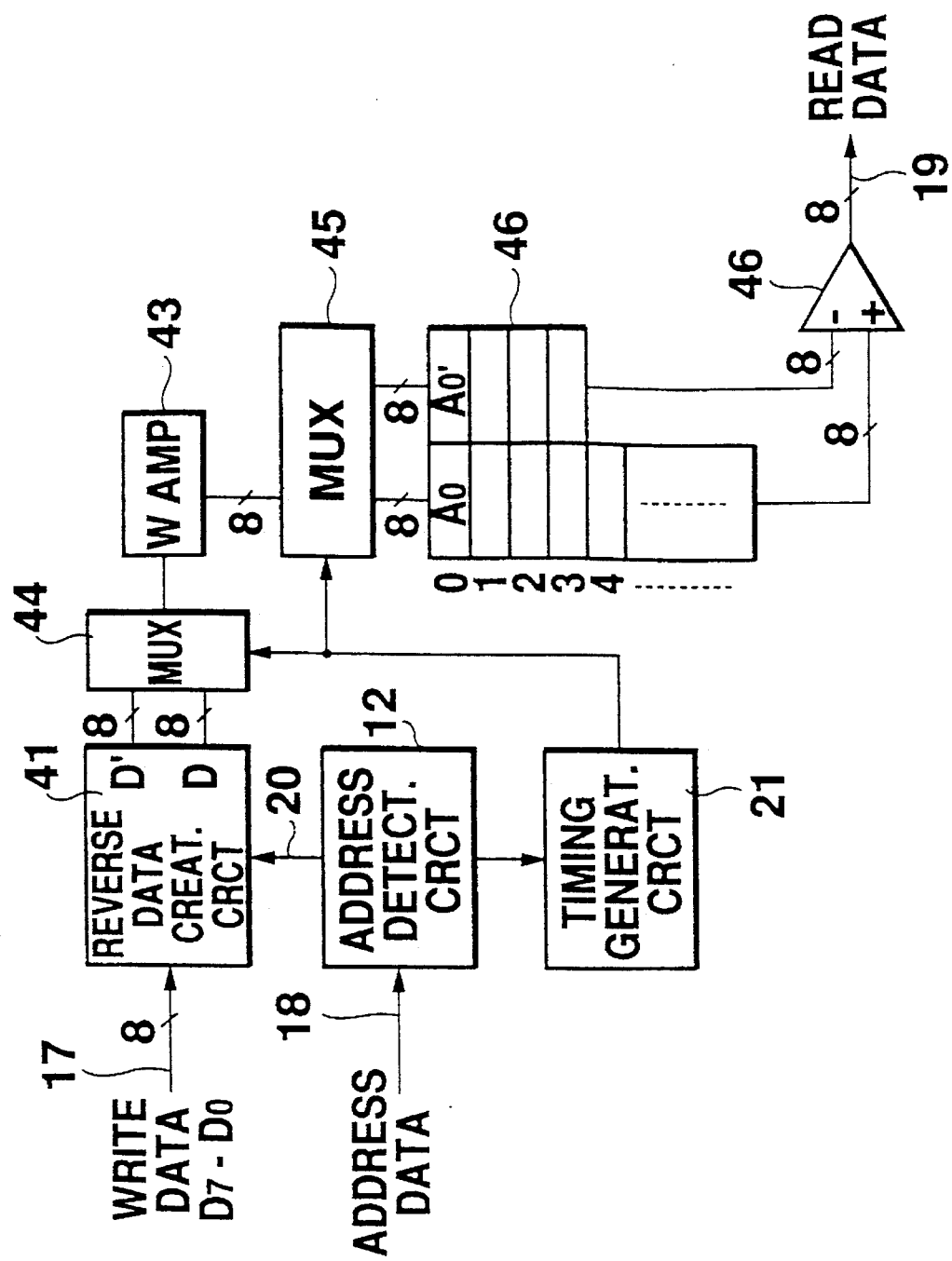
FIG. 4 is a block diagram showing an EEPROM according to a fourth embodiment of the invention.

FIG. 4 shows an EEPROM according to a fourth embodiment of the invention. The circuit of this embodiment is equipped with a reverse data creating circuit 41 for creating data D', which is reverse to the value of the write data, if the address detecting circuit 12 detects a high-frequency reload data address from the address data 18. Upon receipt of a detection signal from the address detecting circuit 12, a timing generating circuit 21 outputs a predetermined timing signal. As switches 44, 45 are actuated at the timing of this timing signal, data D and D' are written into the respective memory cells $A_0$, $A_0'$ of a memory 46 via the switch 44, a write amplifier 43 and the switch 45. These two pieces of data are inputted to a differential read amplifier 47 when reading, and the differential output is outputted as read data 19.

Figure 5:
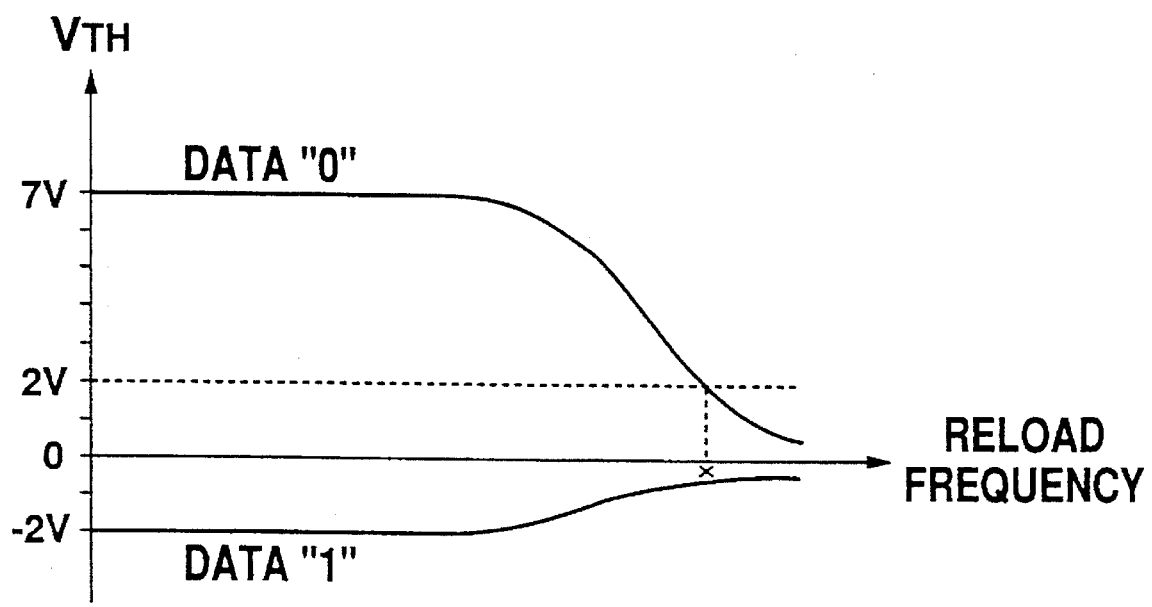
FIG. 5 is a characteristic graph showing the relationship between the memory transistor's threshold voltage and the frequency of rewriting to the EEPROM.
Figure 6:
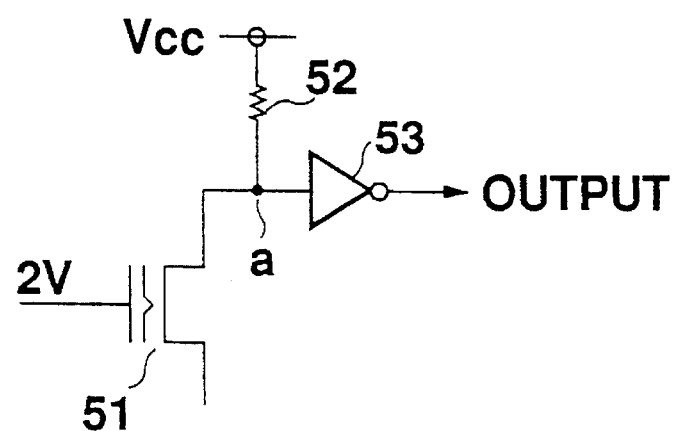
FIG. 6 is a diagram illustrating the principle of reading data from the EEPROM.
Figure 7:
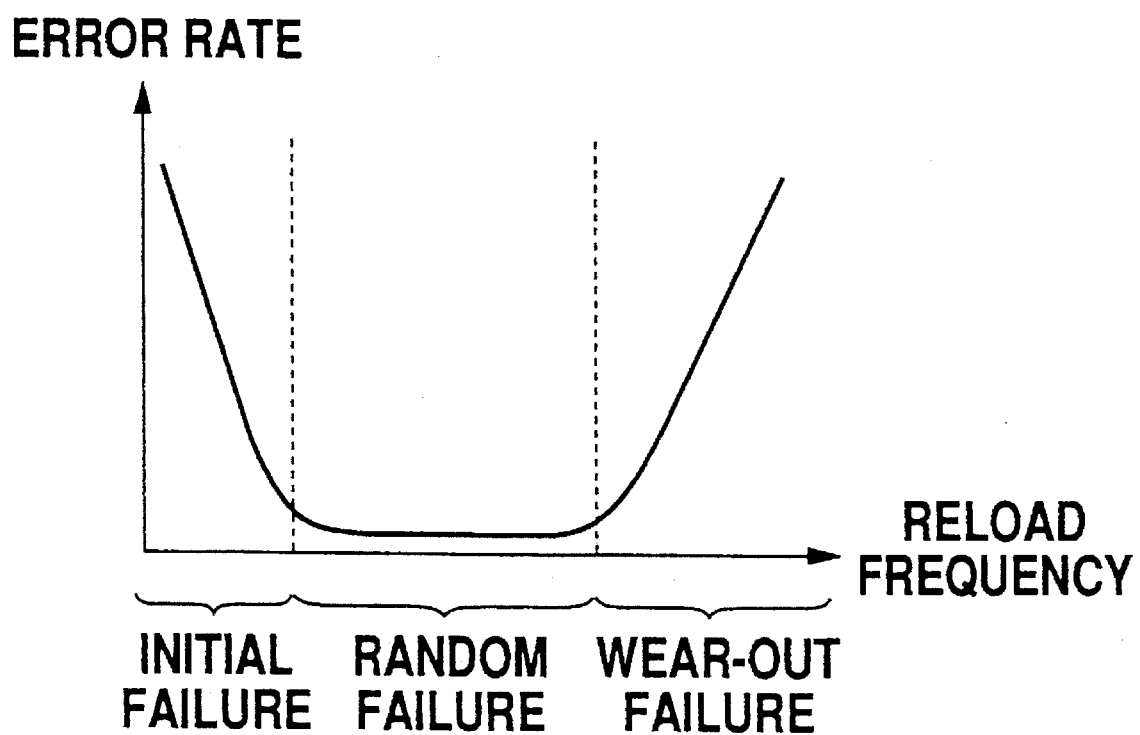
FIG. 7 is a characteristic graph showing the relationship between the error rate and the frequency of reloading in a conventional EEPROM.

The operation of this embodiment will now be described in detail. Generally, in an EEPROM, as shown in FIG. 5, −2 V, for example, is taken as the transistor's threshold voltage $V_{TH}$ in correspondence with the write data "0", and +7 V is taken as $V_{TH}$ in correspondence with the data "1". For reading, as shown in FIG. 6, 2 V is applied as the read voltage to the base of a transistor 51. For example, if the threshold voltage $V_{TH}$ of the transistor 51 is set to +7, the transistor 51 will not be in the ON state so that the potential at a point (a) will be "H" level. As a result, "L" level is outputted as reverse output by an inverter 53. If the threshold voltage $V_{TH}$ of the transistor 51 is set to −2 V, the transistor 51 will be in the ON state, a voltage drop is caused due to a current flowing in a resistive load 52 so that the potential of the point (a) will be "L" level. As a result, the output voltage will be "H" by the inverter 53. In short, when the threshold voltage $V_{TH}$ of the transistor 51 is set to +7 or −2 V, "0" or "1" will be respectively outputted as read data.

However, as shown in FIG. 5, since the higher the frequency of reloading, the closer the respective threshold voltage $V_{TH}$ will become to 0 V, and a read error will definitely occur at a point X after the threshold voltage $V_{TH}$ has become 2 V. But as shown in FIG. 4, the difference between data D and its reverse data D', which are both previously written, is taken when reading; therefore, as shown in FIG. 5, even when the frequency of reloading is X or more, either 7 V level or −2 V level is not inverted so that correct data will be outputted from the differential read amplifier 47, thus extending the life of the memory.

If the detected write address is other than "0"–"3", only the data D is written while the reverse data D' is not written.

In the foregoing embodiments, the memory is of the type in which 1 word is 8 bits. Alternatively, 1 word may be 16 bits or more bits.

Further, in the foregoing embodiments, four addresses "0"–"3" of the memory addresses are set to those for writing data to be reloaded at high frequency. However, this invention should by no means be limited to this illustrated example; such a specified address region may be varied according to need.

As mentioned above, according to this invention, in storing high-frequency reload data and low-frequency reload data in a mixed fashion in the electrically erasable read only memory, since writing is done in a manner depending upon the frequency of reloading of the data, it is not necessary to do write/read processes with reliability more than necessary for the low-frequency reload data on account of the existence of high-frequency reload data in very limited parts, thus saving the memory capacity.

What is claimed is:

1. An electrically erasable read only memory for storing a first type of data and a second type of data together, said first type of data being rewritten with high frequency and said second type of data being rewritten with low frequency, said memory comprising:

(a) write address detecting means for detecting whether data to be written is of said first type by determining whether designated write addresses are within a predetermined range;

(b) data writing means for adding an error correction code to said data and for writing said data to at least three memory cells when said data is determined to be of said first type, and for writing said data to a single memory cell when said data is determined to be of said second type; and (c) error correction means for reading said data written in said at least three memory cells when said predetermined range of addresses are designated during data reading, for selecting one of the read data, and for performing error correction based on said error correction code.

2. An electrically erasable read only memory according to claim 1, wherein said data writing means writes the data in said at least three memory cells in parallel.

3. An electrically erasable read only memory according to claim 2, wherein said data writing means has a plurality of registers for storing the same data and writes the data, which are written in said registers, in said at last three memory cells in parallel.

4. An electrically erasable read only memory according to claim 1, wherein said data writing means writes the data in said at least three memory cells serially.

5. An electrically erasable read only memory according to claim 3, wherein said error correcting means has a plurality of registers and reads the data from said at least three memory cells to said registers serially.

6. An electrically erasable read only memory according to claim 1, wherein said error correcting means selects one of the read data by majority, based on the data read from said at least three memory cells.

\* \* \* \* \*